(12) United States Patent
Derderian et al.

(10) Patent No.: US 7,655,507 B2
(45) Date of Patent: Feb. 2, 2010

(54) MICROELECTRONIC IMAGING UNITS AND METHODS OF MANUFACTURING MICROELECTRONIC IMAGING UNITS

(75) Inventors: James M. Derderian, Boise, ID (US); Bret K. Street, Meridian, ID (US); Eric T. Mueller, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 12/081,003

(22) Filed: Apr. 9, 2008

(65) Prior Publication Data

US 2008/0241985 A1  Oct. 2, 2008

Related U.S. Application Data

(63) Continuation of application No. 10/901,851, filed on Jul. 28, 2004, now Pat. No. 7,402,453.

(51) Int. Cl.
H01L 21/00 (2006.01)

(52) U.S. Cl. .......................... 438/116; 438/64

(58) Field of Classification Search .................. 438/116, 438/64; 257/E21.599
See application file for complete search history.

(56) References Cited

U.S. PATENT DOCUMENTS

| | | | |
|---|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,560,047 A | 10/1996 | Shimada |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |

(Continued)

FOREIGN PATENT DOCUMENTS

EP   0 886 323   12/1998

(Continued)

OTHER PUBLICATIONS

U.S. Appl. No. 10/785,466, Kirby.

(Continued)

*Primary Examiner*—Bradley K Smith
(74) *Attorney, Agent, or Firm*—Dickstein Shapiro LLP (57) ABSTRACT

Methods for manufacturing microelectronic imaging units and microelectronic imaging units that are formed using such methods are disclosed herein. In one embodiment, a method includes coupling a plurality of singulated imaging dies to a support member. The individual imaging dies include an image sensor, an integrated circuit operably coupled to the image sensor, and a plurality of external contacts operably coupled to the integrated circuit. The method further includes forming a plurality of stand-offs on corresponding imaging dies before and/or after the imaging dies are singulated and electrically connecting the external contacts of the imaging dies to corresponding terminals on the support member. The individual stand-offs include a portion between adjacent external contacts.

19 Claims, 9 Drawing Sheets

U.S. PATENT DOCUMENTS

| | | | |
|---|---|---|---|
| 5,708,293 | A | 1/1998 | Ochi et al. |
| 5,771,158 | A | 6/1998 | Yamagishi et al. |
| 5,776,824 | A | 7/1998 | Farnworth et al. |
| 5,811,799 | A | 9/1998 | Wu |
| 5,821,532 | A | 10/1998 | Beaman et al. |
| 5,857,963 | A | 1/1999 | Pelchy et al. |
| 5,861,654 | A | 1/1999 | Johnson |
| 5,877,040 | A | 3/1999 | Park et al. |
| 5,897,338 | A | 4/1999 | Kaldenberg |
| 5,914,488 | A | 6/1999 | Sone |
| 5,977,535 | A | 11/1999 | Rostoker |
| 5,998,862 | A | 12/1999 | Yamanaka |
| 6,080,291 | A | 6/2000 | Woodruff et al. |
| 6,104,086 | A | 8/2000 | Ichikawa et al. |
| 6,111,357 | A | 8/2000 | Fleming et al. |
| 6,114,240 | A | 9/2000 | Akram et al. |
| 6,143,588 | A | 11/2000 | Glenn |
| 6,236,046 | B1 | 5/2001 | Watabe et al. |
| 6,259,083 | B1 | 7/2001 | Kimura |
| 6,266,197 | B1 | 7/2001 | Glenn et al. |
| 6,274,927 | B1 | 8/2001 | Glenn |
| 6,285,064 | B1 | 9/2001 | Foster |
| 6,351,027 | B1 | 2/2002 | Giboney et al. |
| 6,372,548 | B2 | 4/2002 | Bessho et al. |
| 6,407,381 | B1 | 6/2002 | Glenn et al. |
| 6,411,439 | B2 | 6/2002 | Nishikawa |
| 6,483,652 | B2 | 11/2002 | Nakamura |
| 6,503,780 | B1 | 1/2003 | Glenn et al. |
| 6,541,762 | B2 | 4/2003 | Kang et al. |
| 6,566,745 | B1 | 5/2003 | Beyne et al. |
| 6,603,183 | B1 | 8/2003 | Hoffman |
| 6,617,623 | B2 | 9/2003 | Rhodes |
| 6,661,047 | B2 | 12/2003 | Rhodes |
| 6,667,551 | B2 | 12/2003 | Hanaoka et al. |
| 6,670,986 | B1 | 12/2003 | Ben Shoshan et al. |
| 6,686,588 | B1 | 2/2004 | Webster et al. |
| 6,703,310 | B2 | 3/2004 | Mashino et al. |
| 6,864,172 | B2 | 4/2004 | Noma et al. |
| 6,734,419 | B1 | 5/2004 | Glenn et al. |
| 6,759,266 | B1 | 7/2004 | Hoffman |
| 6,767,753 | B2 | 7/2004 | Huang |
| 6,774,486 | B2 | 8/2004 | Kinsman |
| 6,778,046 | B2 | 8/2004 | Stafford et al. |
| 6,791,076 | B2 | 9/2004 | Webster |
| 6,795,120 | B2 | 9/2004 | Takagi et al. |
| 6,797,616 | B2 | 9/2004 | Kinsman |
| 6,800,943 | B2 | 10/2004 | Adachi |
| 6,813,154 | B2 | 11/2004 | Diaz et al. |
| 6,825,458 | B1 | 11/2004 | Moess et al. |
| 6,828,663 | B2 | 12/2004 | Chen et al. |
| 6,828,674 | B2 | 12/2004 | Karpman |
| 6,844,978 | B2 | 1/2005 | Harden et al. |
| 6,882,021 | B2 | 4/2005 | Boon et al. |
| 6,885,107 | B2 | 4/2005 | Kinsman |
| 6,934,065 | B2 | 8/2005 | Kinsman |
| 6,946,325 | B2 | 9/2005 | Yean et al. |
| 2002/0006687 | A1 | 1/2002 | Lam |
| 2002/0057468 | A1 | 5/2002 | Segawa et al. |
| 2002/0089025 | A1 | 7/2002 | Chou |
| 2002/0096729 | A1 | 7/2002 | Tu et al. |
| 2002/0113296 | A1 | 8/2002 | Cho et al. |
| 2002/0145676 | A1 | 10/2002 | Kuno et al. |
| 2003/0062601 | A1 | 4/2003 | Harnden et al. |
| 2004/0012698 | A1 | 1/2004 | Suda et al. |
| 2004/0023469 | A1 | 2/2004 | Suda |
| 2004/0038442 | A1 | 2/2004 | Kinsman |
| 2004/0041261 | A1 | 3/2004 | Kinsman |
| 2004/0082094 | A1 | 4/2004 | Yamamoto |
| 2004/0214373 | A1 | 10/2004 | Jiang et al. |
| 2004/0245649 | A1 | 12/2004 | Imaoka |
| 2005/0052751 | A1 | 3/2005 | Liu et al. |
| 2005/0104228 | A1 | 5/2005 | Rigg et al. |
| 2005/0110889 | A1 | 5/2005 | Tuttle et al. |
| 2005/0127478 | A1 | 6/2005 | Hiatt et al. |
| 2005/0151228 | A1 | 7/2005 | Tanida et al. |
| 2005/0151272 | A1* | 7/2005 | Street et al. ................. 257/787 |
| 2005/0236708 | A1 | 10/2005 | Farnworth et al. |
| 2005/0254133 | A1 | 11/2005 | Akram et al. |
| 2007/0108579 | A1* | 5/2007 | Bolken et al. ............... 257/680 |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/875,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/894,262, Farnworth et al.
U.S. Appl. No. 10/910,491, Bolken et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,760, Chong et al.
U.S. Appl. No. 10/928,598, Kirby et al.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,543, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
U.S. Appl. No. 10/927,550, filed Aug. 26, 2004, Derderian et al.
U.S. Appl. No. 10/915,180, filed Aug. 10, 2004, Street et al.
U.S. Appl. No. 10/893,022, filed Jul. 16, 2004, Hall et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Blackburn, J.M. et al., "Deposition of Conformal Copper and Nickel Films from Supercritical Carbon Dioxide," Science, vol. 294, pp. 141-145. Oct. 5, 2001.
Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.
Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et at "Packaging Technology for Imager Using Through-hole Interconnection in Si Substrate," Proceeding of HDP'04, IEEE, pp. 303-306. Jul. 2004.

IBM, Zurich Research Laboratory, EPON SU-8 photoresist, 1 p., retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/-garbocz/paper58/node3.html>.

King, B. et al., Optomec, Inc., M3D™ Technology, Maskless Mesoscalerm Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report - Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://globalkyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pp., Department of Electrical & Computer Engineering, University of California, Davis.

Optomec, Inc., M3D™ Technology, Maskless Mesoscale Materials Deposition (M3D), 1 page, <httpi/www.optomec.com/html/m3d.htm>, retrieved from the Internet on Aug. 15, 2003.

Optomec, Inc., M3D™, Maskless Mesoscalerm Materials Deposition, 2 pp., <http://www.optornec.com/downloads/M3DSheet.pdf>, retrieved from the Internet on Jun. 17, 2005.

Photo Vision Systems, Inc., "Advances in Digital Image Sensors," 22 pp., First Annual New York State Conference on Microelectronic Design, Jan. 12, 2002.

Shen, X.-J. et al., "Microplastic embossing process: experimental and theoretical characterizations," Sensors and Actuators. A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pp., retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, pp. 89-99, MEMS Design, Fabrication, Characterization, and Packaging, Uwe F. Behringer: Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsitcom/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pp., EE Times, Jul. 18, 2003.

Brubaker, C. et al., "Ultra-thick Lithography for Advanced Packaging and MEMS," SPIE's 27th Annual International Symposium on Microlithography 2002, Mar. 3 - 8, 2002, Santa Clara, Ca.

DuPont Electronic Materials, Data Sheet, Pyralux PC 2000 Flexible Composites, 4 pages, Oct. 1998, <http://www.dupont.com/fcm>.

Micro Chem, Nano SU-8, Negative Tone Photoresist Formulations 50-100, 4 pp., Feb. 2002, <http://www.microchem.com/products/pdf/SU8_50-100.pdf>.

* cited by examiner

MICROELECTRONIC IMAGING UNITS AND METHODS OF MANUFACTURING MICROELECTRONIC IMAGING UNITS

CROSS-REFERENCE TO RELATED APPLICATION

This application is a continuation of application Ser. No. 10/901,851, filed Jul. 28, 2004, now U.S. Pat. No. 7,402,453 the entire disclosure of which is incorporated herein by reference.

TECHNICAL FIELD

The present invention is related to microelectronic imaging units having solid-state image sensors and methods for manufacturing such imaging units.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

Figure 1:
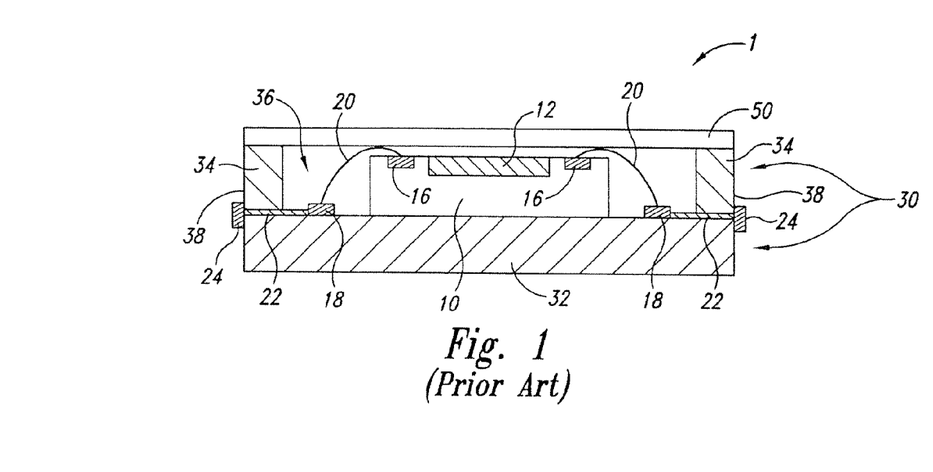
FIG. 1 is a schematic side cross-sectional view of a conventional microelectronic imaging unit in accordance with the prior art.

FIG. 1 is a schematic side cross-sectional view of a conventional microelectronic imaging unit 1 including an imaging die 10, a chip carrier 30 carrying the die 10, and a cover 50 attached to the carrier 30 and positioned over the die 10. The imaging die 10 includes an image sensor 12 and a plurality of bond-pads 16 operably coupled to the image sensor 12. The chip carrier 30 has a base 32, sidewalls 34 projecting from the base 32, and a recess 36 defined by the base 32 and sidewalls 34. The die 10 is accordingly sized to be received within the recess 36 and attached to the base 32. The chip carrier 30 further includes an array of terminals 18 on the base 32, an array of contacts 24 on an external surface 38, and a plurality of traces 22 electrically connecting the terminals 18 to corresponding external contacts 24. The terminals 18 are positioned between the die 10 and the sidewalls 34 so that wire-bonds 20 can electrically couple the terminals 18 to corresponding bond-pads 16 on the die 10.

One problem with the microelectronic imaging unit 1 illustrated in FIG. 1 is that the die 10 must be sized and configured to fit within the recess 36 of the chip carrier 30. Dies having different shapes and/or sizes accordingly require chip carriers configured to house those specific types of dies. As such, manufacturing imaging units with dies having different sizes requires fabricating various configurations of chip carriers and significantly retooling the manufacturing process.

Another problem with conventional microelectronic imaging units is that they have relatively large footprints. For example, the footprint of the imaging unit 1 in FIG. 1 is the surface area of the base 32 of the chip carrier 30, which is significantly larger than the surface area of the die 10. Accordingly, the footprint of conventional microelectronic imaging units can be a limiting factor in the design and marketability of picture cell phones or PDAs because these devices are continually being made smaller in order to be more portable. Therefore, there is a need to provide microelectronic imaging units with smaller footprints.

BRIEF DESCRIPTION OF THE DRAWINGS

FIGS. 2-5 illustrate stages in one embodiment of a method for manufacturing a plurality of microelectronic imaging units in accordance with the invention.

FIGS. 6A-7 illustrate stages in another embodiment of a method for manufacturing a plurality of microelectronic imaging units in accordance with the invention.

FIGS. 8A-9 illustrate stages in another embodiment of a method for manufacturing a plurality of microelectronic imaging units in accordance with the invention.

DETAILED DESCRIPTION

A. Overview

The following disclosure describes several embodiments of methods for manufacturing microelectronic imaging units and microelectronic imaging units that are formed using such methods. One aspect of the invention is directed toward methods for manufacturing a plurality of imaging units. An embodiment of one such method includes coupling a plurality of singulated imaging dies to a support member. The individual imaging dies have an image sensor, an integrated circuit operably coupled to the image sensor, and a plurality of external contacts operably coupled to the integrated circuit. The method further includes forming a plurality of stand-offs on corresponding imaging dies before and/or after the imaging dies are singulated and electrically connecting the external contacts of the imaging dies to corresponding terminals on the support member. The individual stand-offs include a portion between adjacent external contacts.

In another embodiment, a method includes providing a plurality of imaging dies. The individual imaging dies have an image sensor, an integrated circuit operably coupled to the image sensor, and a plurality of external contacts operably coupled to the integrated circuit. The method further includes constructing a plurality of stand-offs on corresponding imaging dies so that the individual stand-offs form a perimeter around an associated image sensor and attaching the imaging dies to a support member. The method further includes electrically connecting the external contacts of the imaging dies to corresponding terminals on the support member and coupling a plurality of covers to corresponding imaging dies. The covers are carried by the stand-offs and positioned over corresponding image sensors.

Another aspect of the invention is directed toward microelectronic imaging units. In one embodiment, an assembly of microelectronic imaging units includes a support member and a plurality of imaging dies attached to the support member. The individual imaging dies have an image sensor, an integrated circuit operably coupled to the image sensor, and a plurality of external contacts operably coupled to the integrated circuit. The assembly further includes (a) a plurality of stand-offs on corresponding imaging dies outboard the image sensors and (b) a plurality of covers coupled to corresponding stand-offs and positioned over the associated image sensors. The individual stand-offs include at least a portion inboard the external contacts.

Specific details of several embodiments of the invention are described below with reference to CMOS imaging units to provide a thorough understanding of these embodiments, but other embodiments can use CCD imaging units or other types of solid-state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, it should be understood that the invention may have other embodiments with additional elements or without several of the elements described below with reference to FIGS. 2-9.

B. Embodiments of Methods for Manufacturing Microelectronic Imaging Units

Figure 2:
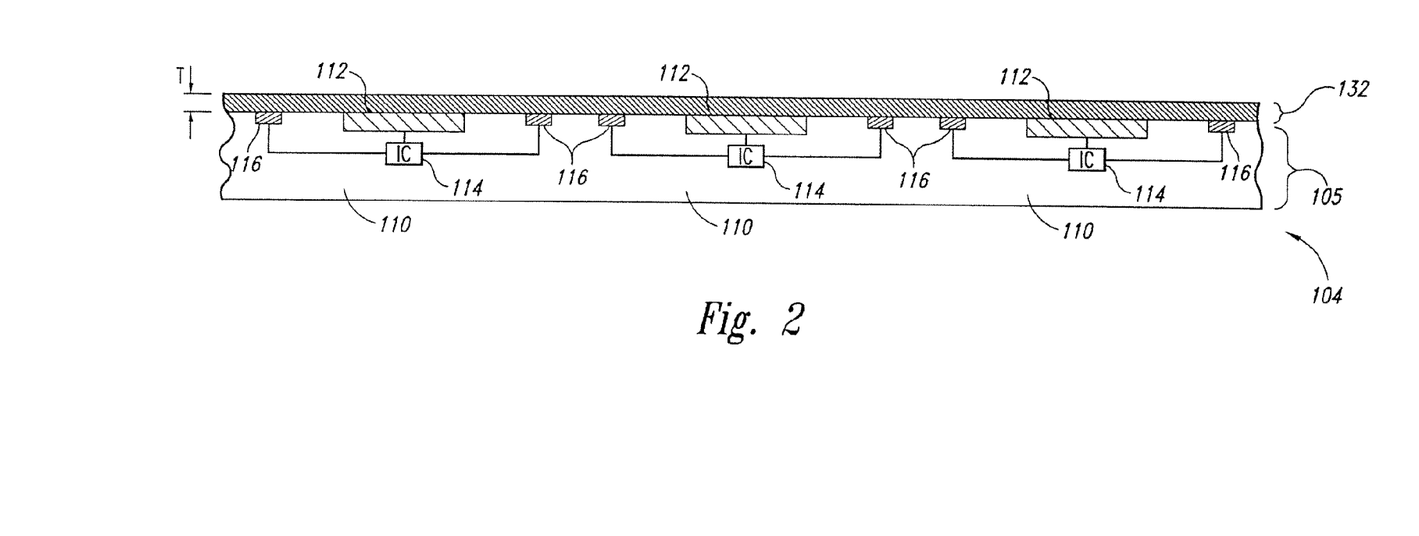
FIG. 2 is a schematic side cross-sectional view of a microfeature workpiece having a substrate and a plurality of microelectronic imaging dies formed in and/or on the substrate.

FIGS. 2-5 illustrate stages in one embodiment of a method for manufacturing a plurality of microelectronic imaging units. FIG. 2, for example, is a schematic side cross-sectional view of a microfeature workpiece 104 having a substrate 105 and a plurality of microelectronic imaging dies 110 (only three are shown) formed in and/or on the substrate 105. The individual imaging dies 110 include an image sensor 112, an integrated circuit 114 (shown schematically) operably coupled to the image sensor 112, and a plurality of external contacts 116 (e.g., bond-pads) operably coupled to the integrated circuit 114. The image sensors 112 can be CMOS devices or CCD image sensors for capturing pictures or other images in the visible spectrum. The image sensors 112 may also detect radiation in other spectrums (e.g., IR or UV ranges).

After forming the imaging dies 110, a stand-off layer 132 is formed across the microfeature workpiece 104. The stand-off layer 132 can be formed on the workpiece 104 by spin-on, film lamination, or other suitable processes. The stand-off layer 132 has a precise thickness T, which corresponds to a desired distance between the image sensors 112 and corresponding covers (FIG. 5), which are placed over the image sensors 112 as described in greater detail below.

Figure 3A:
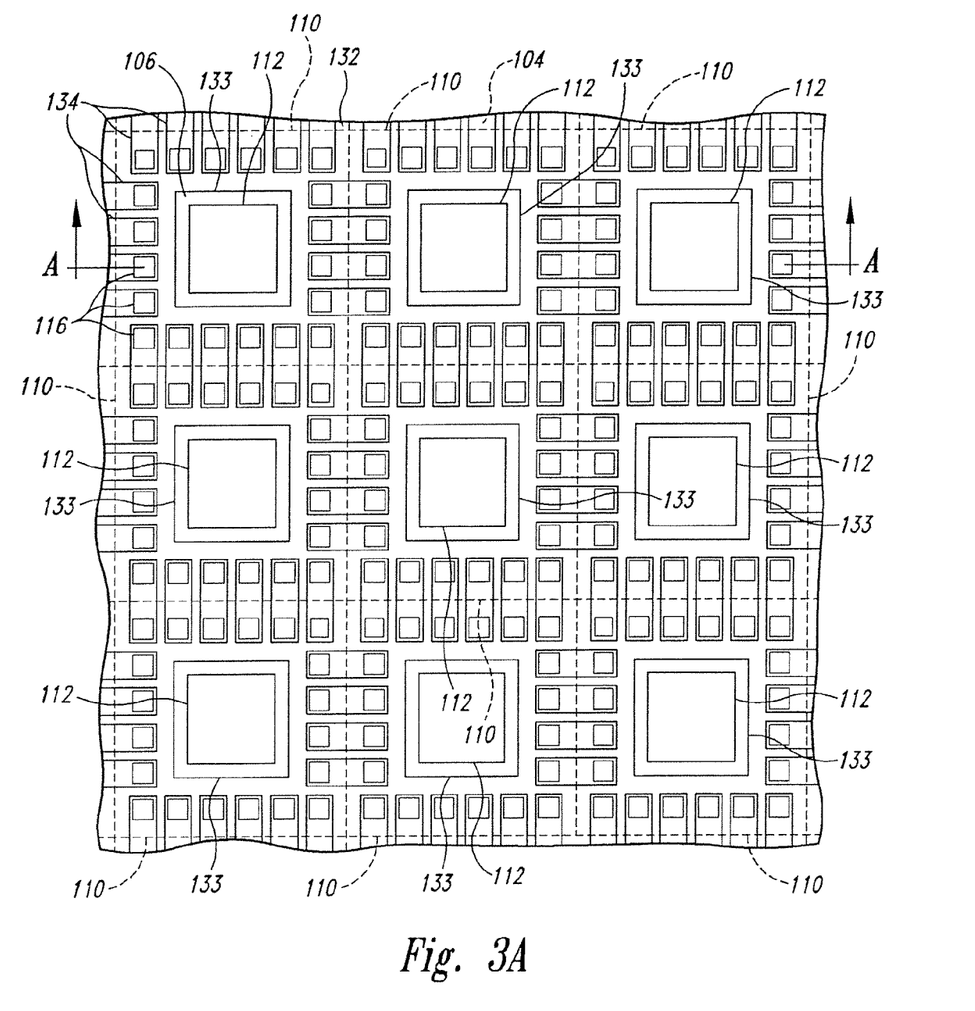
FIG. 3A is a top plan view of the microfeature workpiece after forming a plurality of openings in a stand-off layer.
Figure 3B:
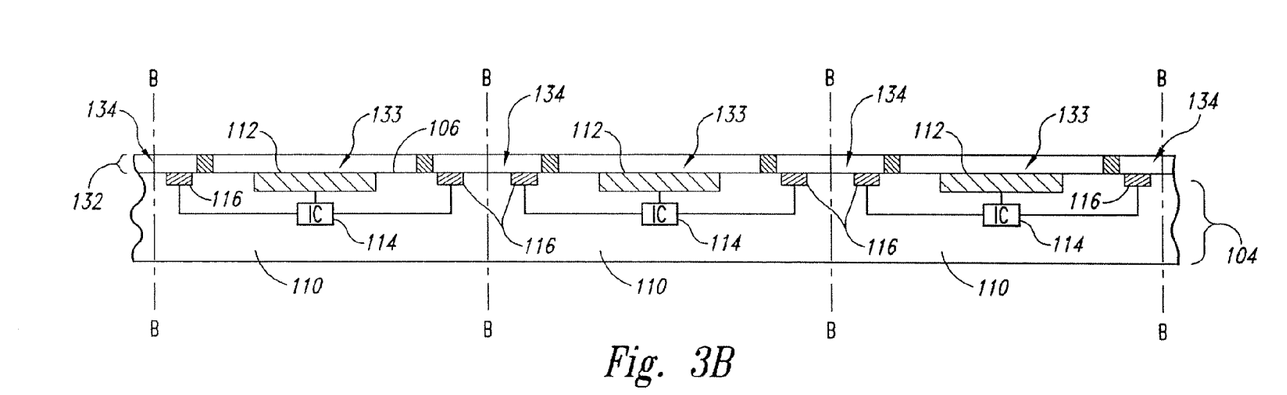
FIG. 3B is a schematic side cross-sectional view taken substantially along line A-A of FIG. 3A.

FIG. 3A is a top plan view of the microfeature workpiece 104 after forming a plurality of openings 133 and 134 in the stand-off layer 132. FIG. 3B is a schematic side cross-sectional view taken substantially along line A-A of FIG. 3A. Referring to both FIGS. 3A and 3B, the illustrated openings 133 expose corresponding image sensors 112 and a portion of a first surface 106 of the workpiece 104 outboard the image sensors 112. In several embodiments, the openings 133 may not expose a portion of the first surface 106 outboard the image sensors 112. In the illustrated embodiment, the individual openings 134 expose adjacent external contacts 116 of adjoining imaging dies 110. In additional embodiments, such as those described below with reference to FIGS. 6A-7, the individual openings 134 may expose only a single contact 116.

The stand-off layer 132 can include an epoxy, a polyimide, or another suitable photo-patternable material. In such embodiments, the openings 133 and 134 are formed by placing a mask on the stand-off layer 132, exposing and developing the mask, and removing portions of the layer 132 over the image sensors 112 and the contacts 116. In other embodiments, the openings 133 and 134 can be formed by stamping, imprinting, or other suitable processes. Moreover, in several embodiments, a stand-off layer can be formed with the openings 133 and 134 by stereolithography, screen printing, stencil printing, or other suitable techniques. In any of these embodiments, after forming the stand-off layer 132 and the openings 133 and 134, the microfeature workpiece 104 can be cut along lines B-B (FIG. 3B) by scribing, sawing, or other suitable processes to singulate the individual imaging dies 110.

Figure 4A:
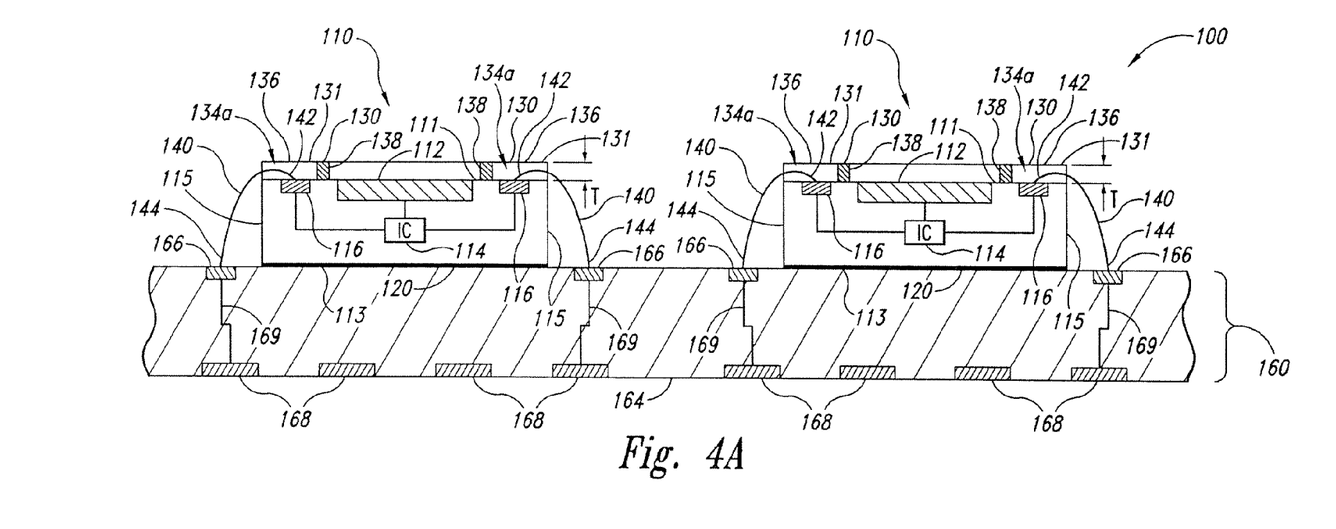
FIG. 4A is a schematic side cross-sectional view of an assembly including a plurality of singulated microelectronic imaging dies arranged in an array on a support member.

FIG. 4A is a schematic side cross-sectional view of an assembly 100 including the singulated microelectronic imaging dies 110 (only two are shown) arranged in an array on a support member 160. The individual singulated imaging dies 110 include a first side 111, a second side 113 opposite the first side 111, and a plurality of ends 115 extending from the first side 111 to the second side 113. The second side 113 of the imaging dies 110 is attached to the support member 160 with an adhesive 120, such as an adhesive film, epoxy, or other suitable material.

The support member 160 can be a lead frame or a substrate, such as a printed circuit board, for carrying the imaging dies 110. In the illustrated embodiment, the support member 160 includes a first side 162 having a plurality of terminals 166 and a second side 164 having a plurality of pads 168. The terminals 166 can be arranged in arrays for attachment to corresponding external contacts 116 of the dies 110, and the pads 168 can be arranged in arrays for attachment to a plurality of conductive couplers (e.g., solder balls). The support member 160 further includes a plurality of conductive traces 169 electrically coupling the terminals 166 to corresponding pads 168.

Figure 4B:
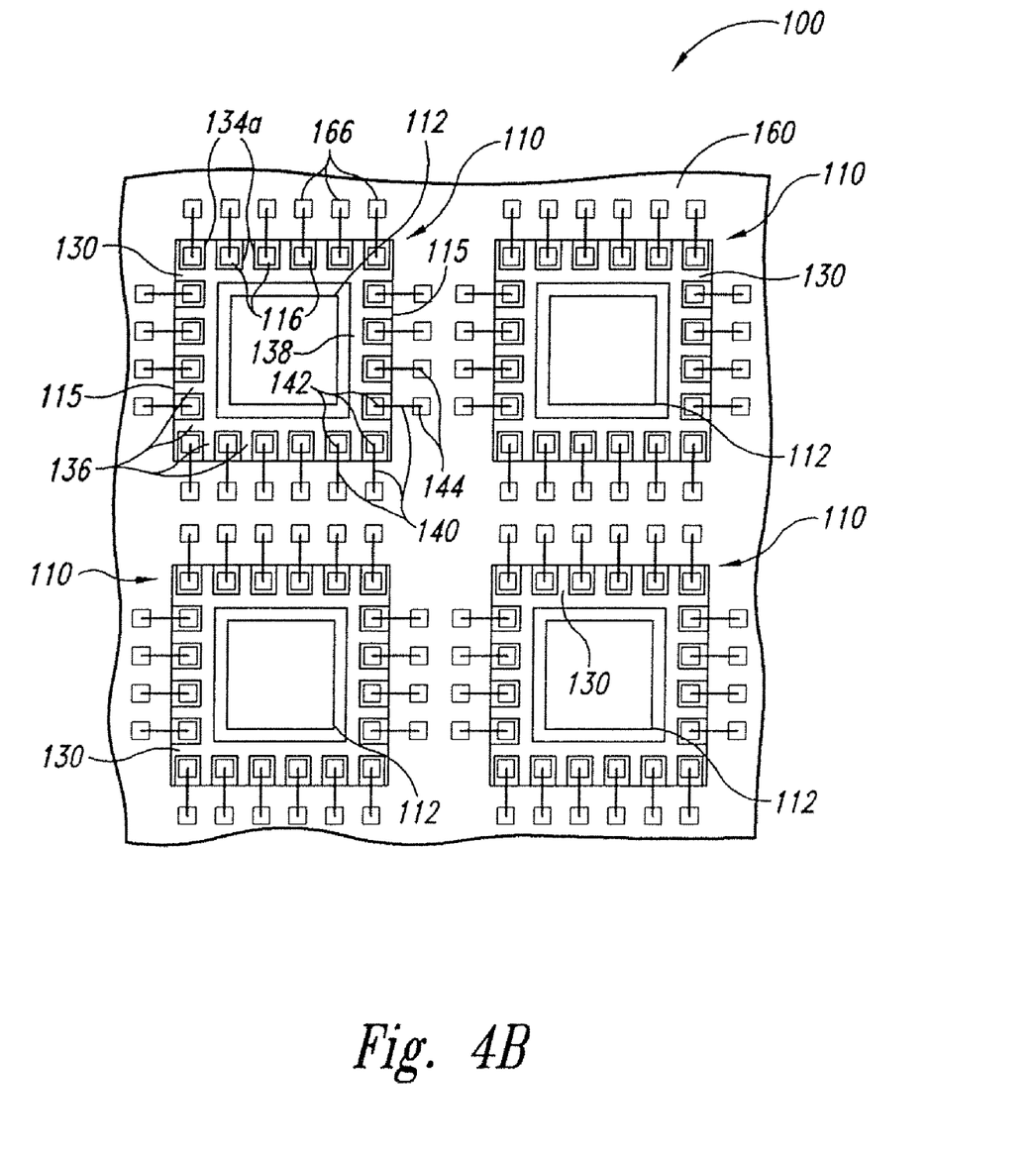
FIG. 4B is a top plan view of the assembly illustrated in FIG. 4A.

FIG. 4B is a top plan view of the assembly 100 illustrated in FIG. 4A. Referring to both FIGS. 4A and 4B, the individual imaging dies 110 include a corresponding stand-off 130 projecting from the first side 111. The individual stand-offs 130 include a plurality of openings 134a over corresponding contacts 116, a first portion 136 directly between adjacent contacts 116, and a second portion 138 inboard the contacts 116 and outboard the image sensor 112. The illustrated openings 134a are slots with an open end proximate to the end 115 of the die 110. Accordingly, the first portion 136 of the stand-offs 130 separates adjacent slots, and the second portion 138 forms a perimeter around the corresponding image sensor 112. The illustrated stand-offs 130 also have a generally flat top surface 131 for supporting covers (FIG. 5) and a height T (FIG. 4A) that corresponds to a precise distance between the image sensors 112 and the covers, as described below with reference to FIG. 5. In additional embodiments, the stand-offs 130 can have other configurations. For example, the stand-offs may not include the first portion 136 between adjacent contacts 116, but rather the stand-offs may be entirely inboard the contacts 116 and outboard the image sensors 112. Moreover, the top surface of the stand-offs may not be flat and/or the openings can be holes rather than slots, as described in greater detail below with reference to FIGS. 6A-7.

The illustrated assembly 100 further includes a plurality of wire-bonds 140 electrically coupling the external contacts 116 of the imaging dies 110 to corresponding terminals 166 on the support member 160. The individual wire-bonds 140 include (a) a proximal portion 142 attached to one of the contacts 116 and received in a corresponding opening 134a and (b) a distal portion 144 attached to the corresponding terminal 166. In other embodiments, the external contacts 116 can be electrically connected to the terminals on a support member by conductive through-wafer interconnects. Through-wafer interconnects are described in U.S. patent application Ser. No. 10/713,878, filed on Nov. 13, 2003, which is hereby incorporated by reference.

Figure 5:
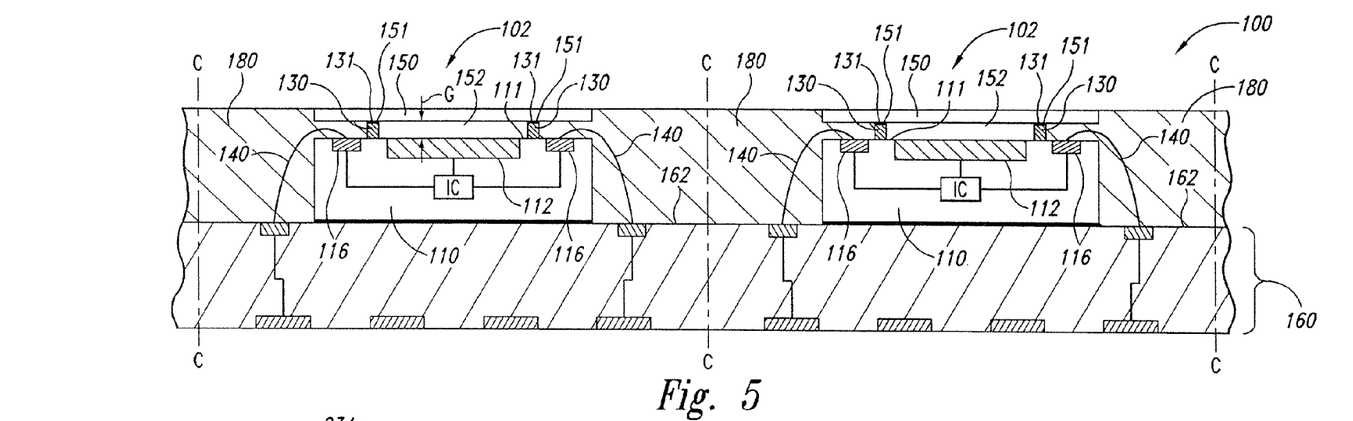
FIG. 5 is a schematic side cross-sectional view of the assembly after attaching a plurality of covers to corresponding stand-offs.

FIG. 5 is a schematic side cross-sectional view of the assembly 100 after (a) attaching a plurality of covers 150 to corresponding stand-offs 130 and (b) depositing a fill material 180 onto the support member 160 between adjacent dies 110. The covers 150 can be attached to the top surface 131 of the stand-offs 130 with an adhesive 151, such as epoxy or acrylic. Alternatively, the stand-offs 130 can be formed of an adhesive material so that an additional adhesive is unnecessary. In either case, the individual covers 150 are positioned over corresponding image sensors 112 and can be glass, quartz, or another suitable material that is transmissive to the desired spectrum of radiation. The covers 150, for example, can further include one or more anti-reflective films and/or filters. The individual covers 150 are spaced apart from the image sensors 112 by a predetermined and precise distance G, which corresponds to the height T (FIG. 4A) of the stand-offs 130. Accordingly, the covers 150, the stand-offs 130, and the first side 111 of the dies 110 define cells 152, which can be filled with gas, such as air, or an underfill material, as described below with reference to FIG. 7. In other embodiments, the assembly 100 can include a single cover attached to multiple stand-offs 130 and covering several imaging dies 110. In several embodiments, the stand-offs 130 can be formed on the covers 150 rather than the imaging dies 110, as described above with reference to FIGS. 2-3B. In such embodiments, after forming the stand-offs 130 on the covers 150, pairs of stand-offs 130 and covers 150 can be attached as units to corresponding imaging dies 110.

After attaching the covers 150 to the stand-offs 130, the fill material 180 is dispensed onto the support member 160 between adjacent imaging dies 110. The fill material 180 can be an epoxy mold compound or another suitable material to at least partially encapsulate the imaging dies 110, the stand-offs 130, the wire-bonds 140, and the covers 150. As such, the fill material 180 (a) increases the robustness of the assembly 100, (b) enhances the integrity of the joint between the individual covers 150 and the imaging dies 110, and (c) protects the image sensors 112 from moisture, chemicals, and other contaminants. After depositing the fill material 180 onto the support member 160, the assembly 100 can be heated to at least partially cure (i.e., B-stage) the fill material 180, the adhesive 151, and/or the stand-offs 130. After curing, the assembly 100 can be cut along lines C-C to singulate individual imaging units 102.

One feature of the imaging units 102 illustrated in FIG. 5 is that the stand-offs 130 are attached to the imaging dies 110. An advantage of this feature is that the footprint of the individual imaging units 102 is smaller than the footprint of conventional imaging units. The reduced footprint of the imaging units 102 is particularly advantageous for picture cell phones, PDAs, or other applications where space is limited. In prior art devices, such as the imaging unit 1 illustrated in FIG. 1, the sidewalls 34 of the chip carrier 30 are outboard the terminals 18 and the wire-bonds 20, which increases the footprint of the imaging unit 1.

One feature of the method for manufacturing imaging units 102 illustrated in FIGS. 2-5 is that the support member 160 can carry imaging dies 110 with different sizes and/or configurations. An advantage of this feature is that the method can be easily adapted to handle various configurations of imaging dies without significant changes to the fabrication process. Prior art methods, such as the method required to form the imaging unit 1 described above with reference to FIG. 1, may require significant retooling because the chip carriers 30 can only carry imaging dies 10 with a certain shape and size.

Another advantage of the method for manufacturing imaging units 102 illustrated in FIGS. 2-5 is that the method is expected to significantly enhance the efficiency of the manufacturing process because a plurality of imaging units 102 can be fabricated simultaneously using highly accurate and efficient processes developed for packaging and manufacturing semiconductor devices. This method of manufacturing imaging units 102 is also expected to enhance the quality and performance of the imaging units 102 because the semiconductor fabrication processes can reliably produce and assemble the various components with a high degree of precision. As such, several embodiments of the method are expected to significantly reduce the cost for assembling microelectronic imaging units 102, increase the performance of the imaging units 102, and produce higher quality imaging units 102.

Figure 6A:
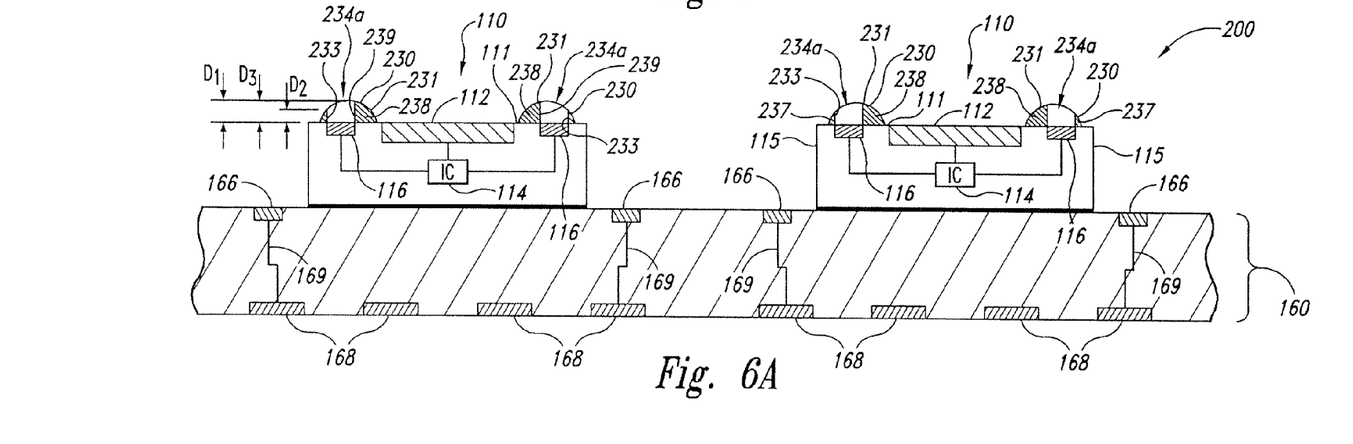
FIG. 6A is a schematic side cross-sectional view of an assembly including a plurality of microelectronic imaging dies arranged in an array on a support member.
Figure 6B:
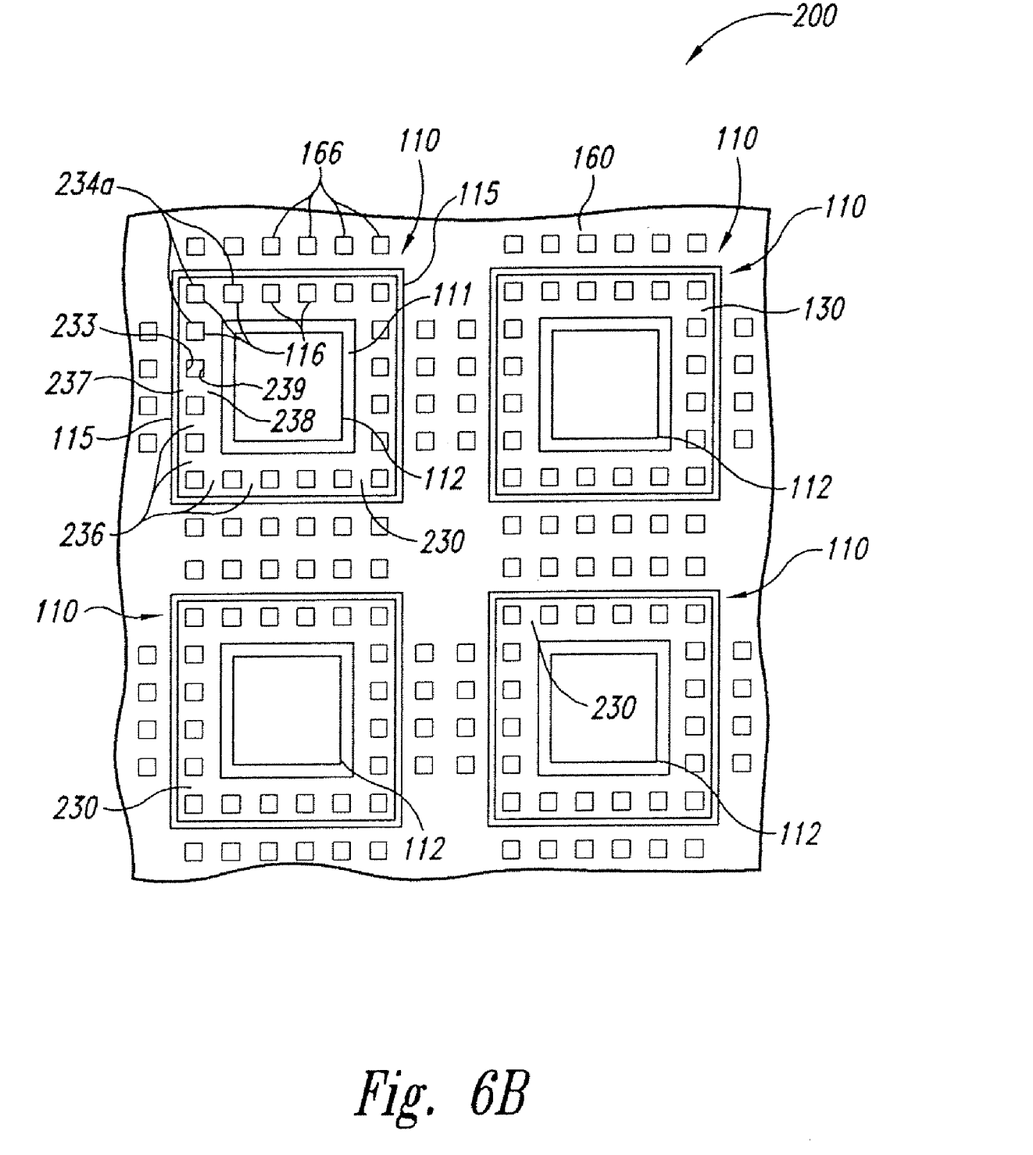
FIG. 6B is a top plan view of the assembly of FIG. 6A.
Figure 7:
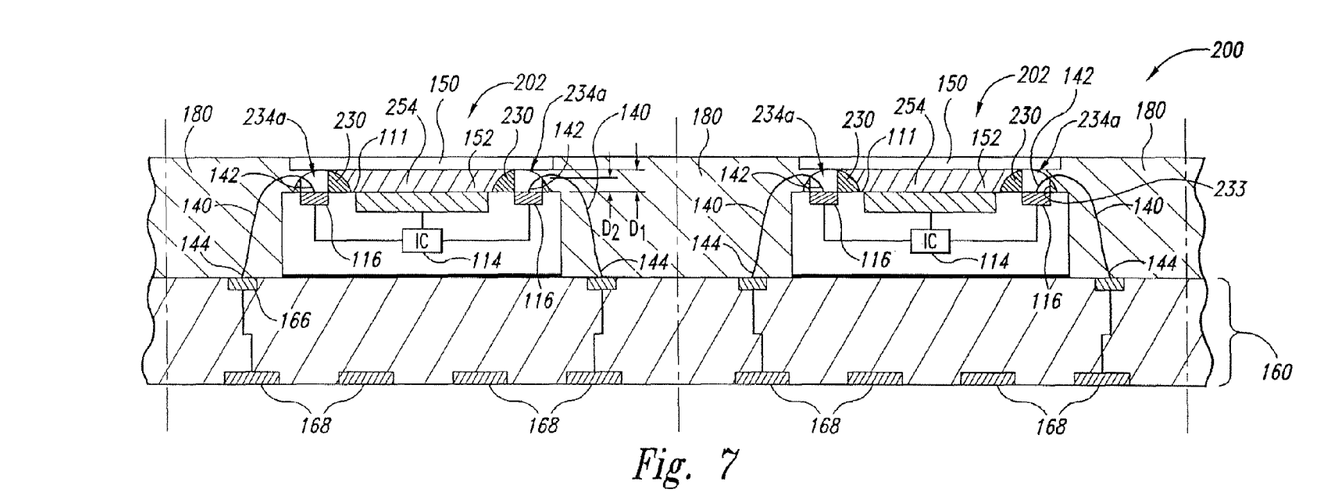
FIG. 7 is a schematic side cross-sectional view of the assembly after wire-bonding the imaging dies to the support member and attaching a plurality of covers to corresponding dies.

C. Additional Embodiments of Methods for Manufacturing Microelectronic Imaging Units FIGS. 6A-7 illustrate stages in another embodiment of a method for manufacturing a plurality of microelectronic imaging units 202 in accordance with the invention. For example, FIG. 6A is a schematic side cross-sectional view and FIG. 6B is a top plan view of an assembly 200 including a plurality of microelectronic imaging dies 110 (only two shown) arranged in an array on a support member 160. The illustrated assembly 200 is generally similar to the assembly 100 described above with reference to FIGS. 4A and 4B. For example, the illustrated assembly 200 includes a plurality of stand-offs 230 disposed on corresponding imaging dies 110. The illustrated stand-offs 230 include a first portion 236 (FIG. 6B) between adjacent contacts 116, a second portion 237 outboard the external contacts 116, and a third portion 238 inboard the external contacts 116. The stand-offs 230 also have a height $D_1$, an arcuate top surface 231 (FIG. 6A), and a plurality of openings 234a between the second and third portions 237 and 238. The illustrated openings 234a are holes aligned with corresponding external contacts 116 and positioned toward an outer portion of the stand-offs 230. As such, the openings 234a include an outer wall 233 with a height $D_2$ (FIG. 6A) and an inner wall 239 with a height $D_3$ (FIG. 6A) greater than the height $D_2$ of the outer wall 233.

FIG. 7 is a schematic side cross-sectional view of the assembly 200 after wire-bonding the imaging dies 110 to the support member 160 and attaching a plurality of covers 150 to corresponding dies 110. The individual wire-bonds 140 include (a) a proximal portion 142 attached to one of the external contacts 116 and received in a corresponding opening 234a and (b) a distal portion 144 attached to the corresponding terminal 166. Because the height $D_1$ of the stand-offs 230 exceeds the height $D_2$ of the outer wall 233 of the openings 234a, the wire-bonds 140 can be formed so that they do not project above the height $D_1$ of the stand-offs 230 and interfere with the attachment of the covers 150 to the top surface 231 of the stand-offs 230. The covers 150 can be attached to corresponding stand-offs 230 with an adhesive, or, alternatively, the stand-offs 230 can be made of an adhesive material.

The illustrated assembly 200 can optionally include an underfill 254 disposed across the first side 111 of the imaging dies 110. As such, the underfill 254 covers the image sensors 112 and fills the cells 152 between the covers 150 and the imaging dies 110. The underfill 254 can be an optical grade material with a high transparency to eliminate or reduce light scattering and/or the loss of images. In applications in which the image sensor 112 has pixels with a smaller size, the underfill 254 can have a higher refractive index to assist in focusing the light for the pixels.

One feature of the imaging units 202 illustrated in FIG. 7 is that the underfill 254 can be a material that is dimensionally stable over a wide range of temperatures. An advantage of this feature is that the distance between the covers 150 and the corresponding image sensors 112 remains generally consistent, even if the imaging units 202 operate in an environment that experiences significant changes in ambient temperature. If the temperature change were to cause the medium between the cover 150 and the image sensor 112 to expand or contract, the associated change in the distance between the cover 150 and the image sensor 112 could skew the images and reduce the life of the imaging unit 202 due to fatigue.

Figure 8A:
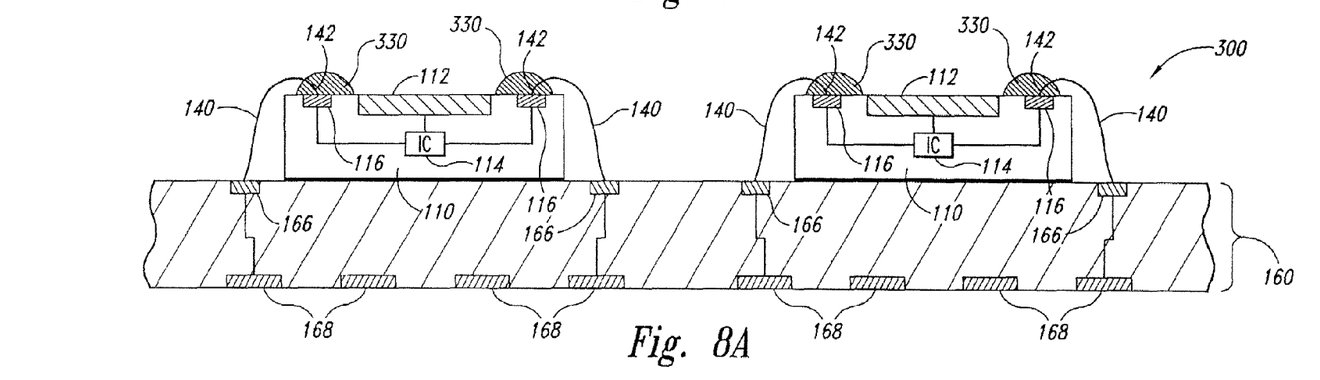
FIG. 8A is a schematic side cross-sectional view of an assembly including a plurality of imaging dies arranged in an array on a support member.
Figure 8B:
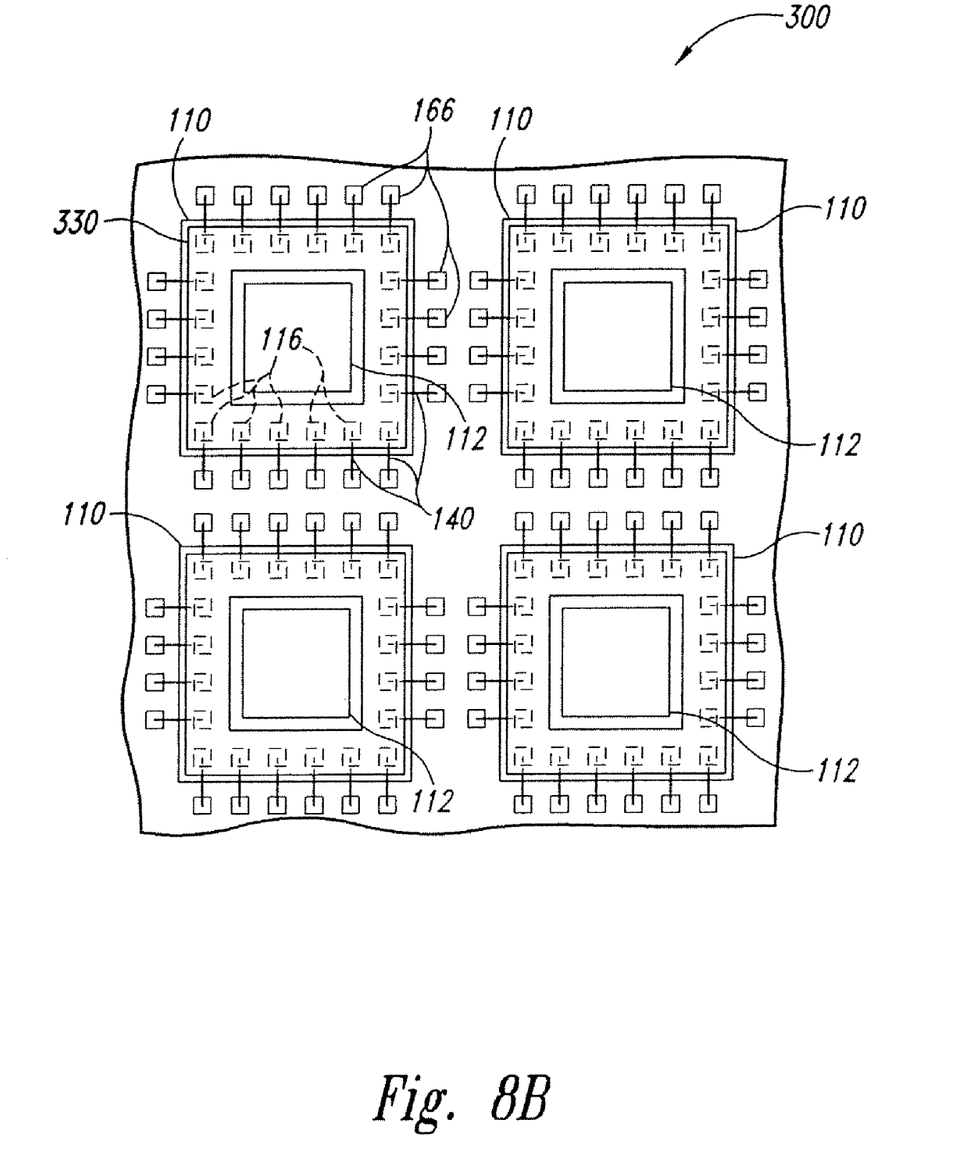
FIG. 8B is a top plan view of the assembly of FIG. 8A.
Figure 9:
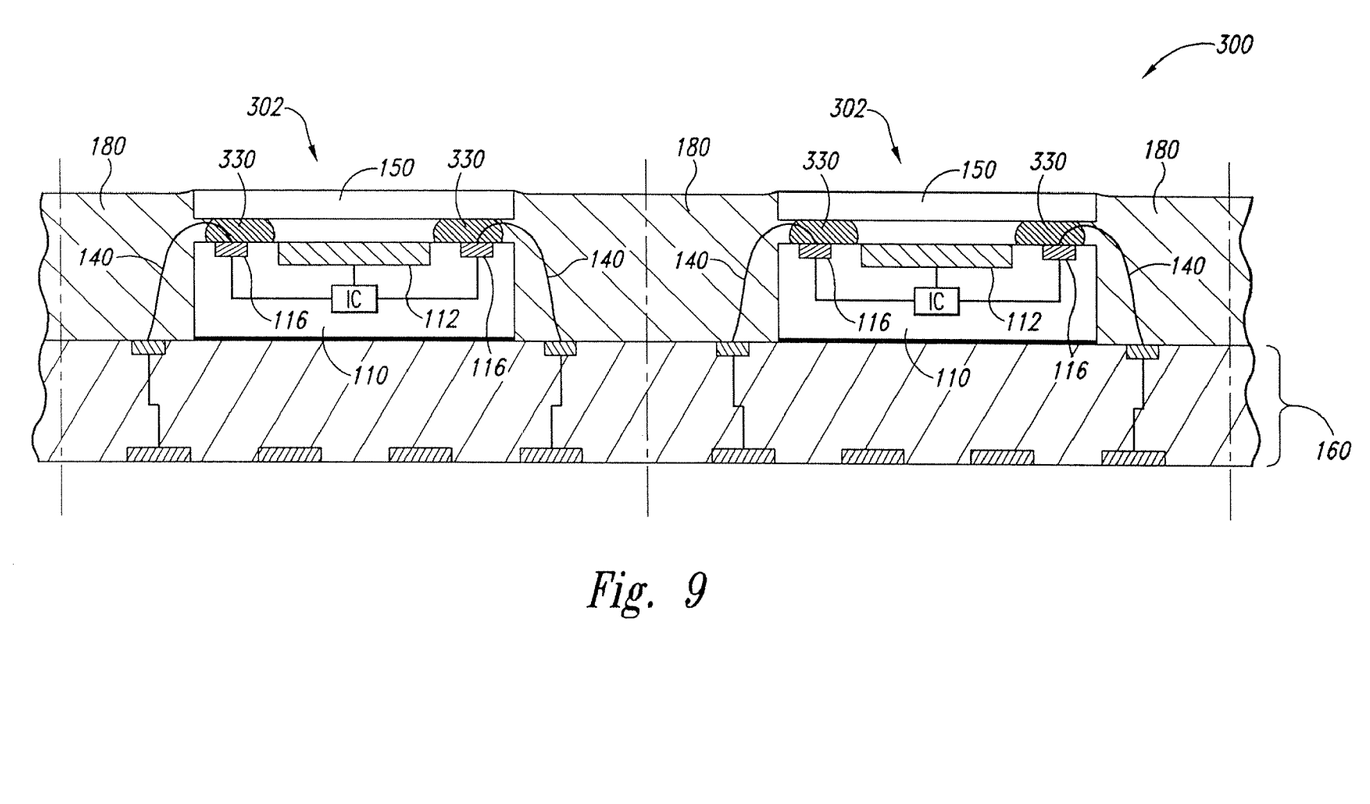
FIG. 9 is a schematic side cross-sectional view of the assembly after attaching a plurality of covers to corresponding imaging dies.

FIGS. 8A-9 illustrate stages in another embodiment of a method for manufacturing a plurality of microelectronic imaging units 302 in accordance with the invention. For example, FIG. 8A is a schematic side cross-sectional view and FIG. 8B is a top plan view of an assembly 300 including a plurality of imaging dies 110 (only two shown) arranged in an array on a support member 160. The illustrated assembly 300 is generally similar to the assembly 200 described above with reference to FIGS. 6A and 6B. For example, the illustrated assembly 300 includes a plurality of stand-offs 330 disposed on corresponding imaging dies 110. The illustrated stand-offs 330, however, do not include openings, but rather encapsulate the proximal portion 142 of the individual wire-bonds 140. The stand-offs 330 can be formed by dispensing a flowable material onto the imaging dies 110 after wire-bonding the dies 110 to the support member 160. Although in the illustrated embodiment the stand-offs 330 are disposed over the external contacts 116, in other embodiments, the stand-offs 330 can be inboard or outboard the contacts 116.

FIG. 9 is a schematic side cross-sectional view of the assembly 300 after attaching a plurality of covers 150 to corresponding imaging dies 110. The covers 150 can be attached directly to the stand-offs 330 in embodiments in which the stand-offs 330 include an adhesive material. For example, the stand-offs 330 can include a UV- or thermally-curable adhesive material. In other embodiments, an adhesive can be placed on a perimeter portion of the covers 150 and/or a top surface of the stand-offs 330 to adhere the covers 150 to the stand-offs 330. In several embodiments, the stand-offs 330 can be formed on the covers 150 and then the covers 150 and the stand-offs 330 can be attached as units to the imaging dies 110.

From the foregoing, it will be appreciated that specific embodiments of the invention have been described herein for purposes of illustration, but that various modifications may be made without deviating from the spirit and scope of the invention. For example, the microelectronic imaging units can have any combination of the features described above. Accordingly, the invention is not limited except as by the appended claims.

We claim:

1. A method of manufacturing an imaging unit, the method comprising:
   forming a stand-off on an imaging die, the imaging die comprising an image sensor, an integrated circuit operably coupled to the image sensor, and a plurality of external contacts operably coupled to the integrated circuit, the stand-off being formed such that a portion of the stand-off is disposed between adjacent external contacts, wherein the stand-off includes openings aligned with the plurality of external contacts;
   attaching the imaging die to a support member; and
   electrically connecting the plurality of external contacts of the imaging die to corresponding terminals on the support member.

2. The method of claim 1, wherein the act of forming an imaging die comprises:
   constructing a plurality of said imaging dies on a microfeature workpiece; and
   cutting the microfeature workpiece to singulate the plurality of imaging dies.

3. The method of claim 2, wherein the act of forming a stand-off occurs prior to the act of cutting the microfeature workpiece.

4. The method of claim 2, wherein the act of forming a stand-off occurs after the act of cutting the microfeature workpiece.

5. The method of claim 1, further comprising attaching a cover to the imaging die, wherein a distance between the image sensor and the cover is determined by the thickness of the stand-off.

6. The method of claim 1, further comprising forming a fill material over the support member.

7. The method of claim 1, wherein the act of forming a stand-off comprises:
   depositing a photo-patternable material over the imaging die; and
   photo-patterning the material to form a plurality of openings aligned with the plurality of external contacts.

8. The method of claim 1, wherein the act of forming a stand-off comprises depositing an adhesive material over the imaging die.

9. The method of claim 1, wherein the act of forming a stand-off comprises forming a stand-off having a flat top surface.

10. The method of claim 1, wherein the act of forming a stand-off comprises forming a stand-off having an arcuate top surface.

11. The method of claim 1, wherein the act of electrically connecting the plurality of external contacts comprises wire-bonding the plurality of external contacts to corresponding terminals.

12. The method of claim 1, wherein the stand-off forms a perimeter around the corresponding image-sensor.

13. The method of claim 1, wherein a portion of the stand-off is disposed inboard the plurality of external contacts and outboard the image sensor.

14. A method of manufacturing an imaging die on a microfeature workpiece, the method comprising:
   forming an imaging die having an image sensor and a plurality of bond-pads on a microfeature workpiece; and
   forming a stand-off on the imaging die such that a portion of the stand-off is disposed directly between adjacent bond-pads, wherein the stand-off includes openings aligned with the plurality of bond-pads.

15. The method of claim 14, wherein a portion of the stand-off is disposed inboard the plurality of bond-pads and outboard the image sensor.

16. The method of claim 14, wherein the act of forming a stand-off comprises depositing an adhesive material over the imaging die.

17. The method of claim 16, wherein the adhesive material is epoxy or acrylic.

18. The method of claim 14, wherein the act of forming a stand-off comprises forming a stand-off having a flat top surface.

19. The method of claim 14, wherein the act of forming a stand-off comprises forming a stand-off having an arcuate top surface.

* * * * *